United States Patent
Chen et al.

[11] Patent Number: 5,982,217
[45] Date of Patent: Nov. 9, 1999

[54] PNP DRIVEN NMOS ESD PROTECTION CIRCUIT

[75] Inventors: Julian Z. Chen, Dallas; Larry B. Li, Plano; Thomas A. Vrotsos, Richardson; Charvaka Duvvury, Plano, all of Tex.

[73] Assignee: Texas Instruments Incorporated, Dallas, Tex.

[21] Appl. No.: 09/025,916

[22] Filed: Feb. 19, 1998

[51] Int. Cl.⁶ .................................................. H03K 5/08
[52] U.S. Cl. ........................ 327/321; 327/310; 327/327
[58] Field of Search .................................. 327/313, 309, 327/310, 321, 327, 328, 432, 483; 361/56, 91

[56] References Cited

U.S. PATENT DOCUMENTS

| | | | |
|---|---|---|---|
| 5,049,834 | 9/1991 | Kasai | 330/255 |
| 5,157,573 | 10/1992 | Lee et al. | 361/56 |
| 5,373,253 | 12/1994 | Bailey et al. | 330/288 |
| 5,465,189 | 11/1995 | Polgreen et al. | 361/58 |
| 5,483,191 | 1/1996 | Boldgett | 327/362 |
| 5,528,188 | 6/1996 | Au et al. | 327/310 |
| 5,646,570 | 7/1997 | Blodgett | 327/362 |
| 5,663,678 | 9/1997 | Chang | 327/566 |

*Primary Examiner*—Terry D. Cunningham
*Assistant Examiner*—Maria Hasanzadah
*Attorney, Agent, or Firm*—Christopher L. Maginniss; W. James Brady; Richard L. Donaldson

[57] ABSTRACT

A novel PNP driven NMOS (PDNMOS) protection scheme is provided for advanced nonsilicide/silicide submicron CMOS processes. The emitter of a PNP transistor and the drain of protection NMOS device are connected to an I/O pad for which ESD protection is provided by the PDNMOS. The collector of the PNP transistor and the gate of the protection NMOS transistor are connected to ground through a resistor. The source of the protection NMOS transistor is grounded. The base of the PNP transistor is connected to either a capacitor or the parasitic capacitor of the integrated circuit.

17 Claims, 5 Drawing Sheets

PNP DRIVEN NMOS ESD PROTECTION CIRCUIT

BACKGROUND OF THE INVENTION

On-chip Electrostatic Discharge (ESD) design in advanced submicron complementary metal-oxide-semiconductor (CMOS) processes becomes more challenging when process feature size continues to scale down. Shallower junctions, thicker salicides, and thinner epitaxial layers in advanced CMOS processes have shown negative impact of the ESD capability of a process. Developing a built-in ESD robustness process or using an extra implant to make the junction deeper are approaches to improve process ESD capability thus improve product ESD protection level. However, for a given process technology, product ESD protection performance will totally rely on the implemented ESD protection scheme and methodology.

In advanced submicron CMOS processes, the thin gate oxide and low drain/substrate breakdown voltage make n-channel metal-oxide-semiconductor (NMOS) the most vulnerable device to an ESD event. Using additional process steps to block the salicide in the ESD NMOS and output NMOS could achieve an adequate ESD performance. However, this method increases product costs due to additional process masks required. Additionally, extra impedance is added into the signal path due to the non-silicided contact-to-gate spacing (CGS) of the output NMOS. The additional impedance in the signal path limits its current driving capability and its application in high speed analog/mixed-signal designs. The gate-coupled NMOS (GCNMOS) was first proposed as an effective protection device for CMOS. Subsequently, a substrate trigger NMOS (STNMOS) protection scheme for advanced submicron CMOS processes has been developed which does not require the use of additional masks or introduction of additional impedance. The requirement of a large chip capacitance on the power supplies in this protection scheme also limits its application in small analog/mixed-signal chip designs.

A key issue for ESD design is to ensure the ESD protection circuit turns on with a small on-resistance so as to conduct most of the ESD current during an ESD event. A trigger element with a low trigger voltage is required for such an ESD protection scheme. In advanced submicron BiCMOS processes, a zener breakdown voltage of about a base-emitter junction of a bipolar junction transistor (BJT) is utilized for that purpose. In advanced submicron CMOS processes, this option is not available. The lowest junction breakdown voltage is known as the NMOS drain junction breakdown voltage. Therefore, the characteristics of an NMOS device in a particular process dictate the ESD protection design.

FIG. 1a illustrates graphs of current (I) (in milliamps) vs. voltage (in volts, V) of a typical I–V breakdown characteristic for a NMOS transistor under different gate bias conditions as measured in a TLP system with a 200 ns pulse width. Vt1 is the first turn-on voltage of a parasitic lateral npn (LNPN) transistor associated with the NMOS transistor. Vt2 is the second breakdown voltage and Vsp is the snapback voltage. Beyond the second breakdown which is signified by Vt2, the NMOS enters the regime of thermal runaway which can result in damage to the NMOS. The corresponding second breakdown current (It2), which is not labeled in FIG. 1a, but which is the corresponding current for Vt2 on the I–V characteristic shown in FIG. 1a, is a key process ESD parameter for monitoring the high current handling capability of the NMOS. When the NMOS operates in the snapback mode or the bipolar breakdown region, the lateral NPN (LNPN) of the NMOS conducts most of the drain terminal current. It has been found that It2 strongly depends on the Beta of the LNPN, the NMOS channel length, the salicide thickness, the drain junction depth, and the epi layer thickness. An improved It2 can result from an optimized process. For a given process, the success of a typical multi-finger NMOS protection design strictly depends on how to design a protection circuit to enable most of the LNPNs, which are the NMOS fingers of a protection NMOS scheme, to turn on and uniformly conduct ESD current during ESD events. Uniformity in turning on the LNPNs (or NMOS fingers) can be achieved by increasing snapback on-resistance (Ron) to increase Vt2 to being greater than Vt1 or by reducing Vt1 to being less than Vt2. If Vt1 is designed to be lower than Vt2, each LNPN of a NMOS finger would, during an ESD event, turn on to conduct the ESD current before any single LNPN reaches second breakdown, Vt2.

FIG. 2a illustrates a simplified layout of the fingered NMOS showing the fingers embodied in the alternating pattern of drains (D) and sources (S). FIG. 2b illustrates a layout/schematic of the fingered NMOS.

On-resistance, Ron, can be easily increased by increasing the drain/source contact to poly gate spacing in nonsilicided processes. But in silicided processes, a silicide block mask is needed in order to get a good ESD protection performance. Increasing substrate potential or applying a small positive bias voltage to the substrate can reduce Vt1 below Vt2. With this technique, a Substrate Triggering NMOS (STNMOS) protection scheme was recently developed for silicide submicron CMOS processes. This type of ESD protection scheme works with large digital application-specific processor (ASPs) chips. However, the large chip capacitance associated with the relatively large size of these ASP chips limits the application of the STNMOS for a small mixed-signal chip. The reduction of Vt1 can also be achieved by increasing the NMOS gate potential. As shown in FIG. 1a, when the gate voltage is high enough, Vt1 is approximately Vsp which is less than Vt2.

Figure 1A:
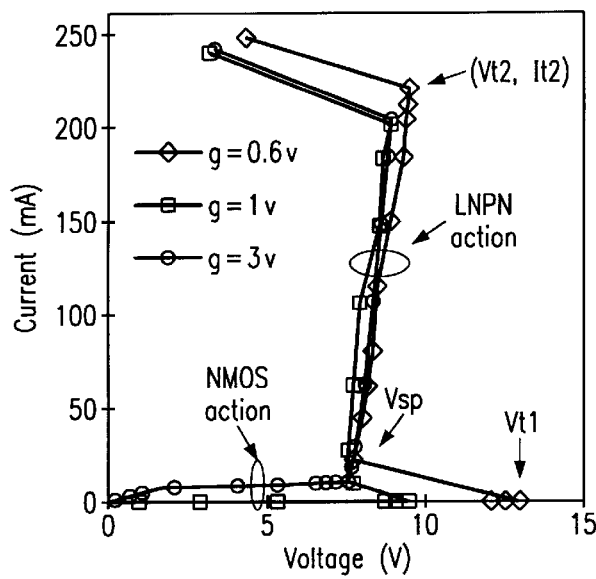
FIG. 1a illustrates graphs of current (I) (in milliamps) vs. voltage (in volts, V) of a typical I–V breakdown characteristic for a NMOS transistor under different gate bias conditions as measured in a transmission line pulse (TLP) system. Vt1 is the first turn-on voltage of the parasitic LNPN transistor.

Reference numerals are carried forward and backward among the drawings.

DETAILED DESCRIPTION OF THE INVENTION

Figure 2A:
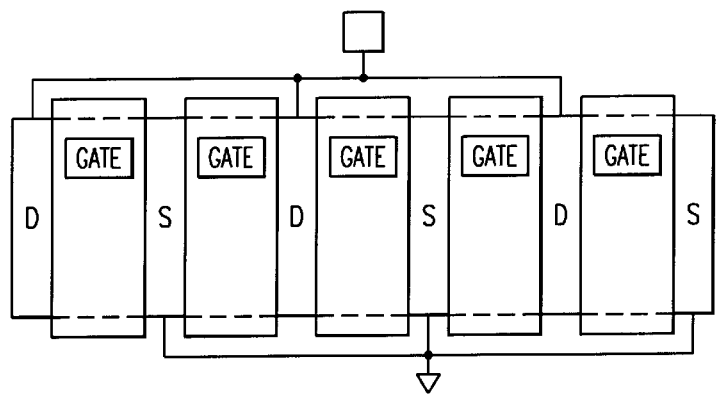
FIG. 2a illustrates a simplified layout of the fingered NMOS showing the fingers embodied in the alternating pattern of drains (D) and sources (S).
Figure 2B:
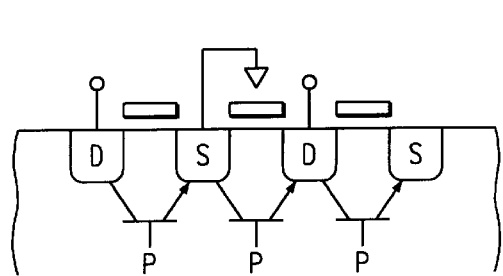
FIG. 2b illustrates a simplified cross-section of the fingered NMOS transistor. The LNPN transistors are indicated for the fingered portions of the NMOS.
Figure 2C:
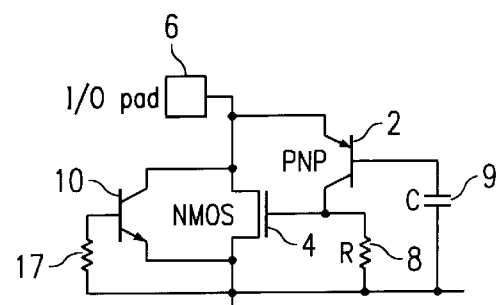
FIG. 2c is a simplified schematic drawing of the invention's PNP Driven NMOS (PDNMOS) ESD protection circuit.

The invention provides ESD protection for devices resulting from advanced CMOS processes. During an ESD event, the gate of the protection NMOS is driven by a PNP device to reduce Vt1 of each LNPN and to force all NPNs to turn on. When Vt1<Vt2 every NPN finger will turn on before one of these LNPN fingers reach Vt2, a situation that can result in damage. FIG. 2c is a simplified schematic drawing of the invention's PNP Driven NMOS (PDNMOS) ESD protection circuit. The emitter of PNP transistor 2 and the drain of protection NMOS 4 are connected to I/O pad 6 for which ESD protection is provided by the PDNMOS. The collector of PNP transistor 2 and the gate of protection NMOS transistor 4 are connected to ground through resistor 8. The source of protection NMOS transistor 4 is grounded. The base of PNP transistor 2 is connected to a capacitor 9. The emitter of transistor 2 is connected to an input/output port (I/O). During an ESD event, capacitor 9 will provide base current to PNP transistor 2. Capacitor 9 can be realized by the parasitic chip capacitance of the power supply in the integrated circuit incorporating the circuit. This capacitor is preferably implemented as a pariasistic capacitor because it saves chip space and it ensures that the ESD circuit is in an off state when the pad voltage is within rail-to-rail range during non-ESD event operation. The collector current of PNP transistor 2 biases up the gate of protection NMOS transistor 4 through resistor 8 to turn on NMOS transistor 4 followed by turn on of the parasitic lateral NPN (LNPN) transistor 10 (in conjunction with a voltage across parasitic resistor 17 and the base emitter junction of transistor 10) when the voltage at pad 6 is approximately at voltage Vsp (a voltage level shown in FIG. 1a).

Figure 3:
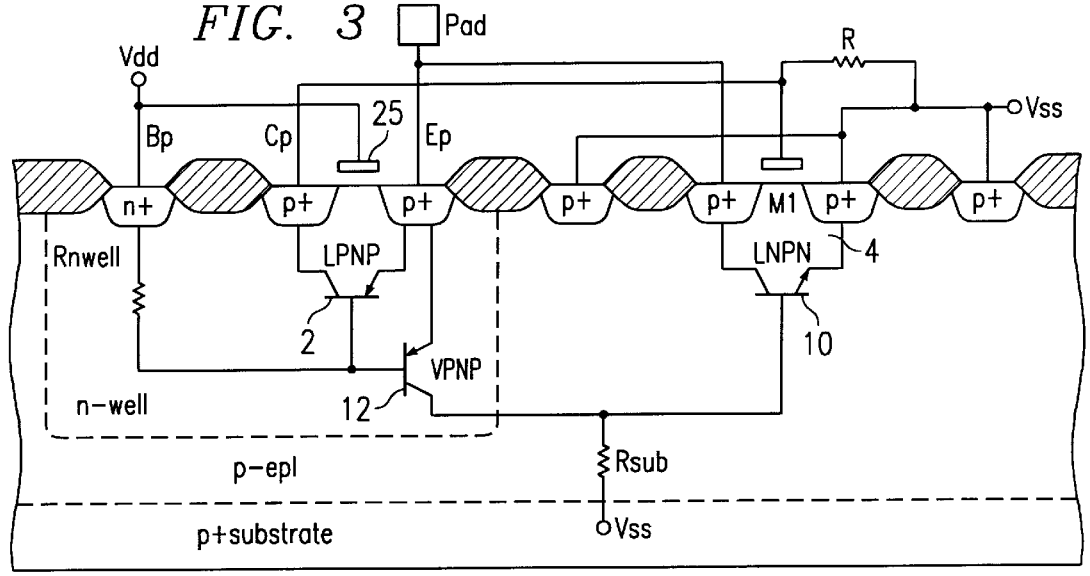
FIG. 3 illustrates a cross-sectional view with schematic circuit representations of the invention's PDNMOS protection scheme.

FIG. 3 illustrates a cross-sectional view with schematic circuit representations of the invention's PDNMOS protection scheme. PNP transistor 2 is realized by a lateral PNP (LPNP) which is built in a n-well as is a PMOS device. A minimum poly gate length is used to enhance PNP action by minimizing the LPNP base width. In FIG. 3, parasitic vertical PNP (VPNP) transistor 12 is illustrated which is formed by a n-well, a p+ diffusion in the n-well and a p-epi layer. In the VPNP transistor 12, both emitter and base are the same as that of the LPNP transistor 2 shown. However, the collector of the VPNP transistor is in the p-epi layer. Under bias, LPNP transistor 2 and VPNP transistor 12 turn on. In FIG. 3, p+ and n+ doped regions are noted as shown, along with power supply voltages Vdd and Vss. As illustrated, the PDNMOS device lies on a p+ doped substrate which underlies a p-epi region.

Figure 4:
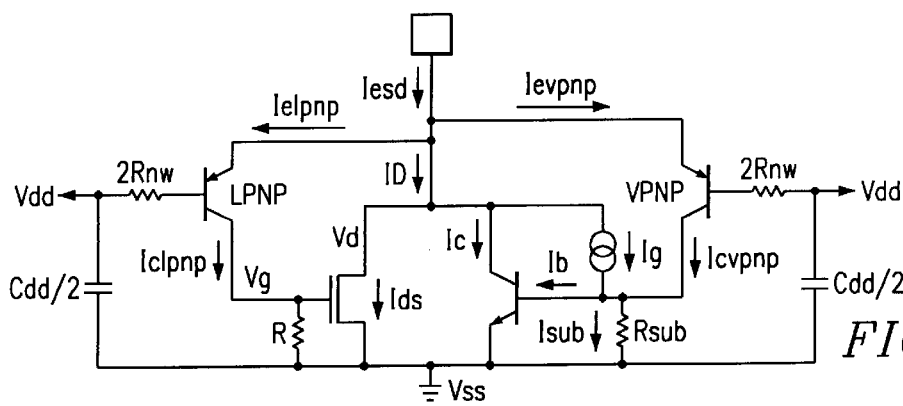
FIG. 4 is a schematic drawing showing the equivalent circuit of that shown in FIG. 3.

FIG. 4 is a schematic drawing showing the equivalent circuit of that shown in FIG. 3. The total ESD current, Iesd, is a sum of the LPNP and VPNP emitter currents, the NMOS current, Ids, and the LNPN collector current Ic. Ig is the generation current given by Ig=(M−1) (Ids+Ic)=Ib+Isub−Icvpnp, where M is the multiplication factor dependent on the drain junction voltage Vd, Ib is the LNPN base current, Isub is the substrate current and Icvpnp is the VPNP collector current. Before the LNPN turns on Ib=Ic=0. The trigger of the LNPN relies on the base potential which is determined by Isub=(M−1) (Ids+Icvpnp) for a given process and substrate resistance Rsub. For higher Ids and/or Icvpnp, it is easier to turn on the LNPN at a specific M. Hence, it is important that during an ESD event, a gate driven NMOS protection must have a sufficient Ids and/or Icvpnp to obtain Vt1<Vt2.

Figure 5:
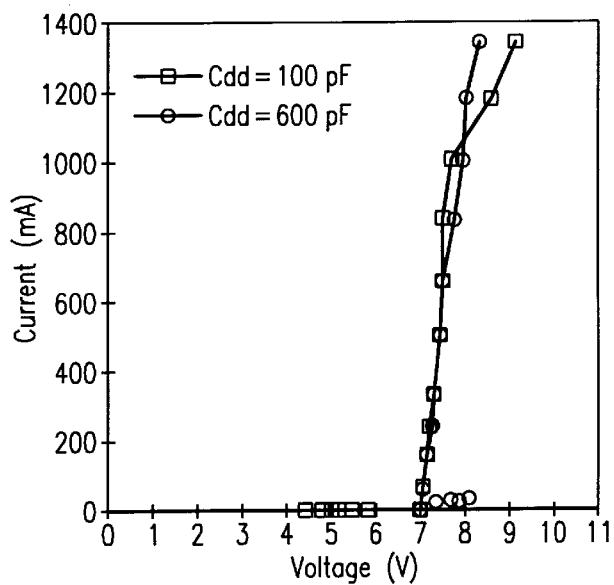
FIG. 5 illustrates current vs. voltage curve measured for an experimental PDNMOS device fabricated using a 0.72 $\mu$m non-silicided CMOS process.

FIG. 5 illustrates current vs. voltage curve measured for an experimental PDNMOS device fabricated using a 0.72 $\mu$m non-silicided CMOS process. This curve is of course pertinent for a particular set of process conditions as are all of the graphs or charts contained herein. The layout of the experimental PDNMOS device followed process design rules and minimum spacings were used. FIG. 5 shows that Vt1 is equal to the snap-back voltage (Vsp) of approximately 8 volts of the single NMOS transistor (the level indicated in FIG. 1). The 1 volt lower Vsp of the PDNMOS compared to that of a single NMOS is due to the turn-on of multiple LNPNs which result in more Isub being generated at a given Vd.

Figure 6:
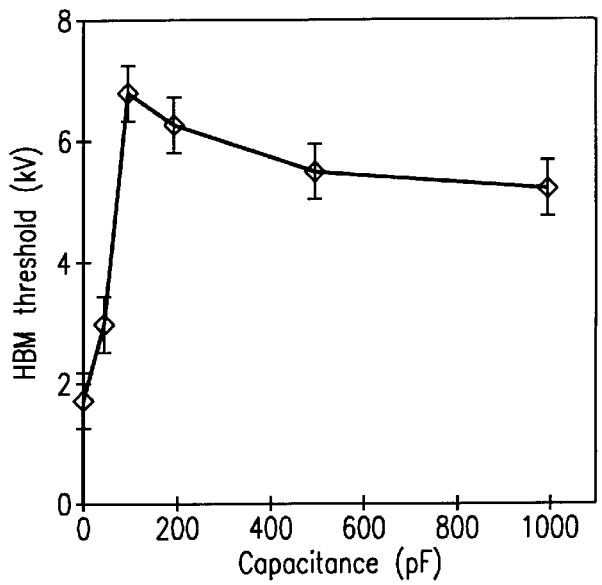
FIG. 6 shows the HBM results as a function of Cdd. The peak ESD performance of 6 kV is obtained for 100–200 pF Cdd, which is a typical Cdd range in most analog/mixed-signal products.

FIG. 6 shows the HBM results as a function of Cdd. The peak ESD performance of 6 kV is obtained for 100–200 pF Cdd, which is a typical Cdd range in most analog/mixed-signal products. The low trigger ESD performance at low values of Cdd is because the gate voltage Vg of the NMOS was not high enough to generate sufficient Ids to trigger LNPN action in most NMOS fingers (the Icvpnp current is low also for a low Cdd). The reason for low ESD performance at large values of Cdd was due to the Vg being too high.

Figure 7:
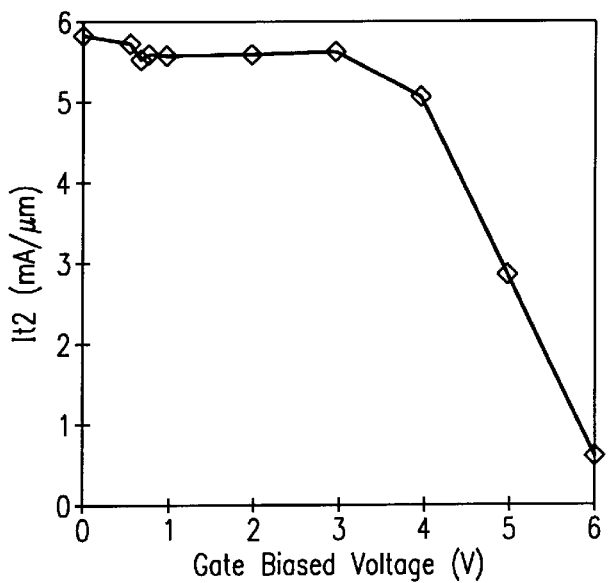
FIG. 7 illustrates, for the experimental PDNMOS, the NMOS It2 degradation for high gate bias.

FIG. 7 illustrates, for the experimental PDNMOS, the NMOS It2 degradation for high gate bias. It is seen that It2 starts to decrease when Vg rises above 3V. The voltage must be clamped at the gate of the NMOS in order to stem this decrease in current (It2). The clamp can assume a number of different forms, e.g. one or more diode connected transistors (bipolar or field-effect (e.g. NMOS, PMOS)). The PDNMOS ESD performance can be optimized using SPICE simulation to identify the design window for a specific Cdd. Hence, the size of the PNP, the size of R and the use of p-n diodes or NMOS devices to clamp the protection NMOS gate voltage can be determined.

Figure 8A:
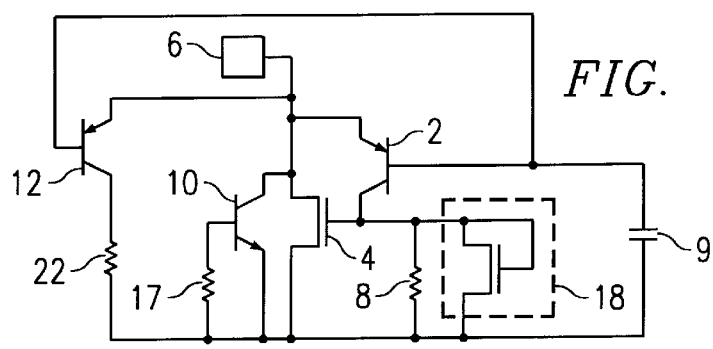
FIG. 8a shows schematic drawing of a full PDNMOS protection scheme.

FIG. 8a illustrates a schematic drawing of an embodiment of the invention's PDNMOS which includes clamp 18 (denoted by the dashed box) shown here as a diode-connected NMOS transistor. However, clamp 18 can also assume one of the above mentioned additional forms. Transistor 2 in FIG. 8a is fabricated as a lateral pnp bipolar transistor and it provides an additional circuit path to ground from bond pad 6 in conjunction with pnp bipolar transistor 12 which is fabricated as a vertical pnp bipolar transistor. Clamp 18 can be substituted with another type of clamp (e.g. series forward biased diodes or a zener clamp).

Figure 8B:
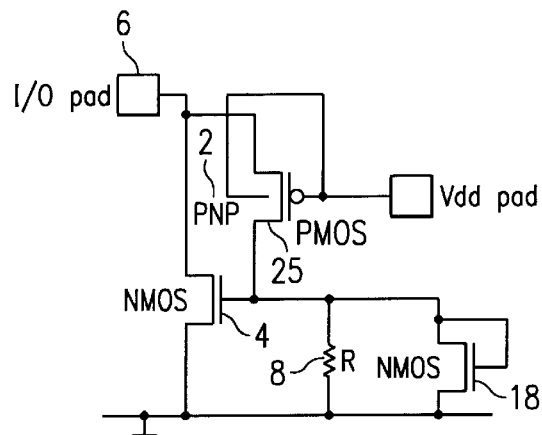
FIG. 8b illustrates a simplified PDNMOS protection scheme which was used to run a SPICE simulation.
Figure 9:
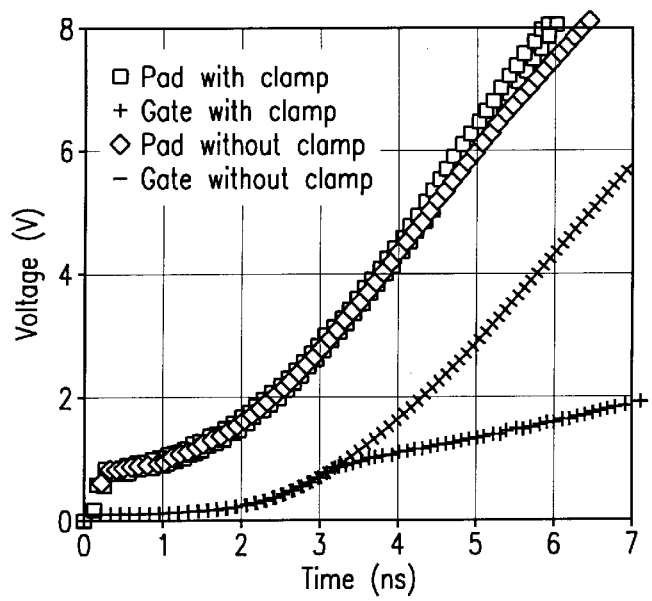
FIG. 9 illustrates a SPICE simulation plot of current vs. voltage is for a PDNMOS is shown in FIG. 8b.

FIG. 8b shows a PDNMOS protection scheme which was used to run a SPICE simulation that excludes LNPN action for simplicity. Additionally in FIG. 8b a diode-connected PMOS transistor 25 is connected across the pnp transistor indicated at reference numeral 2. Transistor 2 can be parasitic and this embodiment furthers the switching of high voltage on bond pad 6 to ground. The gate of transistor 25 is connected to a drain voltage (Vdd) pad for the circuit. A SPICE simulation of a PDNMOS in FIG. 9 illustrates that the Vg is 1.8 V with a NMOS clamp and 4.5 V without the clamp, when the pad voltage develops to 8V during an ESD event. Hence, the figure shows that the clamp limits the Vg. PDNMOS can also be used for a power supply protection for a circuit which has at least two power supplies with the same voltage level.

Figure 10:
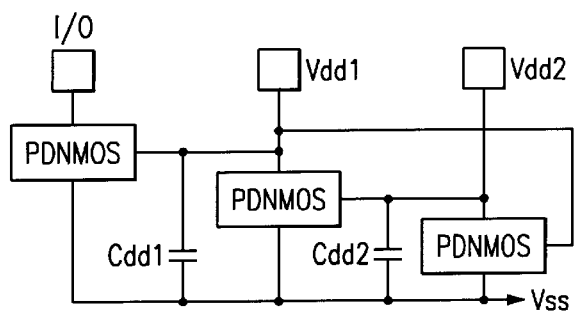
FIG. 10 illustrates a block diagram of the PDNMOS implementation for a multiple power supply chip.
Figure 11:
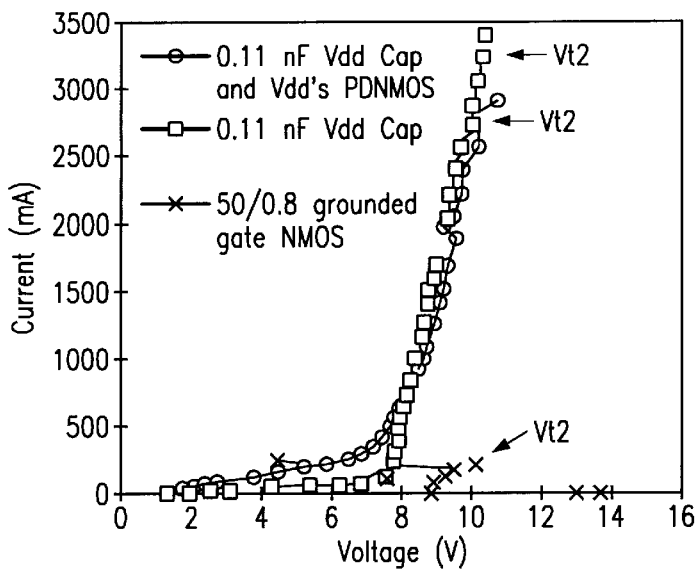
FIG. 11 the TLP results of a PDNMOS fabricated in a 0.8 $\mu$m silicided CMOS process.

FIG. 10 shows a block diagram of the PDNMOS implementation for a multiple power supply chip with capacitors Cdd1 and Cdd2 being connected as shown to a respective PDNMOS. FIG. 10 shows two power supplies at the same voltage level. During experiments, PDNMOS was successfully implemented in both non-silicided and silicided submicron CMOS processes. The TLP results of a PDNMOS fabricated in a 0.8 $\mu$m silicided CMOS process are shown in FIG. 11. FIG. 11 clearly shows that the LNPN turns on and conducts most current up to over 2.8 A. The 1000/0.8 $\mu$m protection NMOS of the PDNMOS results in a 2.8 mA–3.2 mA/$\mu$m It2. An I–V curve of a 40/0.8 gate grounded NMOS (GGNMOS) is also shown in the figure. The It2 of the 50/0.8 NMOS is about 200 mA (4 mA/$\mu$m). If each finger of the PDNMOS handles 200 mA ESD current, the It2 of the PDNMOS indicates that about 70–80% of the fingers are conducting. However It2 of a multi-finger NMOS per $\mu$m would be lower than the It2 of a single NMOS due to the heating coupling effect in the multi-finger NMOS.

Figure 12:
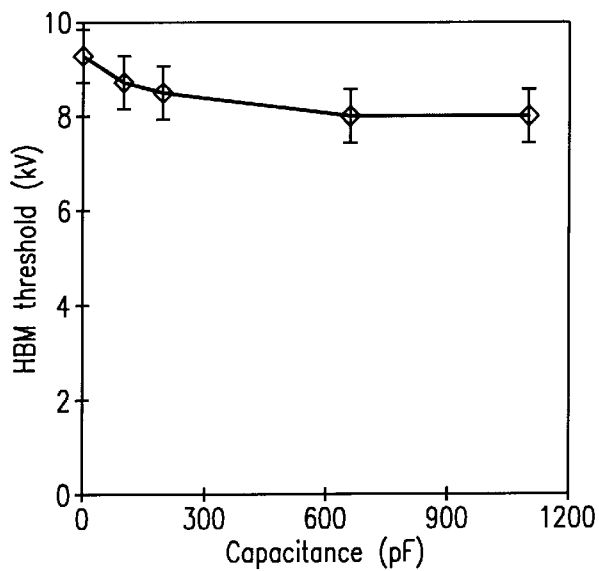
FIG. 12 shows the HBM result for the PDNMOS at different Cdd values in a 0.8 $\mu$m silicided CMOS process.
Figure 13:
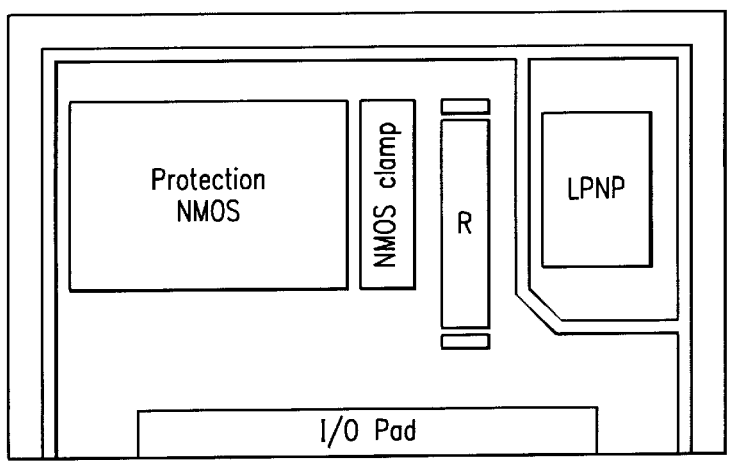
FIG. 13 is a FA picture of a PDNMOS.

FIG. 12 shows the HBM result for the PDNMOS at different Cdd. The design was optimized for a small Cdd. The ESD performance is 9 kV for 10–50 pF Cdd. FIG. 13 is a FA picture of a PDNMOS. It shows the PDNMOS failures after ESD stress. Multiple finger damage is shown in this picture. This demonstrates that most fingers turn-on during an ESD event.

Although the invention has been described in detail herein with reference to its preferred embodiment, it is to be understood that this description is by way of example only, and it is not to be construed in a limiting sense. It is to be further understood that numerous changes in the details of the embodiments of the invention, and additional embodiments of the invention, will be apparent to, and may be made by persons of ordinary skill in the art having reference to this description. For instance, parasitic devices discussed herein can be fabricated as actual devices and vice versa. Additionally, the PDNMOS can be fabricated using discrete devices or it can be fabricated as an integrated circuit. Additionally, the PDNMOS can be fabricated using both silicided and non-silicided processes. It is contemplated that all such changes and additional embodiments are within the true scope and spirit of the invention as claimed below.

We claim:

1. An electrostatic discharge protection circuit comprising:

a field effect transistor including a gate, a drain, and a source, said source coupled to circuit ground;

a resistor connected to and between said gate and circuit ground;

a pnp bipolar transistor including a base, collector and emitter, wherein said emitter is connected to said drain, said collector is connected to said gate; and an input/output connection to said drain and said emitter of said pnp transistor, said electrostatic discharge protection circuit being fabricated as a single integrated circuit on a semiconductor chip, said single integrated circuit having a parasitic capacitance coupled between said base and circuit ground.

2. An electrostatic discharge protection circuit as recited in claim 1 wherein said field effect transistor is a NMOS transistor.

3. An electrostatic discharge protection circuit as recited in claim 1 which further includes a npn parasitic bipolar transistor including a collector connected to said drain and an emitter connected to said source.

4. A plurality of electrostatic discharge protection circuits of the type recited in claim 1 wherein each said protection circuit is connected to a plurality of power supplies.

5. An electrostatic discharge protection circuit as recited in claim 1 wherein said circuit is fabricated by a non-silicided process.

6. An electrostatic discharge protection circuit as recited in claim 1 wherein said circuit is fabricated by a silicided process.

7. An electrostatic discharge protection circuit comprising:

a pnp bipolar transistor including a base, collector and emitter;

a field effect transistor including a drain, a source, and a gate, said gate being connected to said collector of said pnp bipolar transistor, said drain being connected to said emitter of said pnp bipolar transistor and said source being connected to ground;

an input/output connection to said drain and said emitter of said pnp bipolar transistor;

a npn bipolar transistor including a base, collector and emitter, said collector of said npn bipolar transistor being connected to said drain, said emitter of said npn bipolar transistor being connected to said source and said base of said npn bipolar transistor being connected to ground;

a capacitor, including a first terminal and a second terminal, being connected at said first terminal to said base of said pnp transistor and said capacitor being connected at said second terminal to said source; and a resistor connected to and between said gate and source.

8. An electrostatic discharge protection circuit as recited in claim 7 wherein said field effect transistor is a NMOS transistor.

9. A plurality of electrostatic discharge protection circuits of the type recited in claim 7 wherein said protection circuit is connected to a plurality of power supplies.

10. An electrostatic discharge protection circuit comprising:

a p-type field effect transistor including a body, a gate, a drain and a source;

a first n-type field effect transistor including a gate, a drain and a source, said source of said first n-type transistor coupled to circuit ground, said gate of said first n-type transistor being connected to said drain of said p-type transistor, said drain of said first n-type transistor being connected to said source of said p-type transistor, said body of said p-type transistor being connected to said gate of said p-type transistor said gate of said p-type transistor coupled to a terminal for receiving a source of potential thereon;

an input/output connection to said drain of said n-type transistor and said source of said p-type transistor;

a second n-type field effect transistor including a gate, a drain and a source, said drain and said gate of said second n-type transistor being connected together, said source of said second n-type transistor coupled to circuit ground; and a resistor including a first and a second terminal, said first terminal being connected to said gate of said first n-type transistor, said drain of said p-type transistor and said drain of said second n-type transistor, said second terminal being connected to said source of said first n-type transistor and said source of said second n-type transistor.

11. An electrostatic discharge protection circuit as recited in claim 10 wherein said field effect transistor is a NMOS transistor.

12. A plurality of electrostatic discharge protection circuits of the type recited in claim 10 wherein each said protection circuit is connected to a plurality of power supplies.

13. An electrostatic discharge protection circuit comprising:

a field effect transistor including a gate, drain, and a source, said source coupled to circuit ground;

a resistor connected to and between said gate and circuit ground;

a pnp bipolar transistor including a base, collector and emitter wherein said emitter is connected to said drain and said gate;

a voltage clamp connected across said resistor; and an input/output connection connected to said drain and said emitter of said pnp transistor, said electrostatic discharge protection circuit being fabricated as a single integrated circuit on a semiconductor chip, said single integrated circuit having a parasitic capacitance, said base is coupled to said parasitic capacitance.

14. An electrostatic discharge protection circuit as recited in claim 13 wherein said clamp consists of a diode connected transistor, a diode, a series of connected diodes, a series of connected transistors, or a combination thereof.

15. An electrostatic discharge protection circuit as recited in claim 14 wherein said diode connected transistor consists of a PMOS or an NMOS transistor.

16. An electrostatic discharge protection circuit as recited in claim 13 which further includes a capacitor connected to an between said base of said pnp bipolar transistor and circuit ground.

17. An electrostatic discharge protection circuit as recited in claim 16 which further includes a second pnp bipolar transistor coupled at its emitter to said drain of said field effect transistor and coupled at its collector to circuit ground.

* * * * *

UNITED STATES PATENT AND TRADEMARK OFFICE
CERTIFICATE OF CORRECTION

PATENT : 5,982,217
DATED : November 9, 1999
INVENTOR(S) : Julian Z. Chen, Larry B. Li, Thomas A. Vrotsos, Charvaka Duvvury It is certified that error appears in the above-identified patent and that said Letters Patent is hereby corrected as shown below:

On the title page, insert item [60] Related U.S. Application Data as follows:

Related U.S. Application Data
--[60]  Provisional application no. 60/038,282 Feb. 19, 1997.--.

In column 1, line 6, insert the following:
--This application claims priority under 35 USC § 119(e)(1) of
  provisional application number 60/038,282, filed Feb. 19, 1997.--.

Signed and Sealed this

Fourth Day of July, 2000

Attest:

Q. TODD DICKINSON

*Attesting Officer*   *Director of Patents and Trademarks*